US009887462B2

(12) United States Patent
Contreras et al.

(10) Patent No.: US 9,887,462 B2
(45) Date of Patent: Feb. 6, 2018

(54) ANTENNA WITH EMBEDDED WIDEBAND MATCHING SUBSTRATE

(71) Applicant: MOTOROLA SOLUTIONS, INC, Schaumburg, IL (US)

(72) Inventors: Nereydo T. Contreras, Fort Lauderdale, FL (US); Giorgi Bit-Babik, Plantation, FL (US); Antonio Faraone, Fort Lauderdale, FL (US); William R. Williams, Coral Springs, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 576 days.

(21) Appl. No.: 14/069,156

(22) Filed: Oct. 31, 2013

(65) Prior Publication Data

US 2015/0116182 A1    Apr. 30, 2015

(51) Int. Cl.
*H01Q 1/50* (2006.01)
*H01Q 5/50* (2015.01)
(Continued)

(52) U.S. Cl.
CPC ............... *H01Q 5/50* (2015.01); *H01Q 1/242* (2013.01); *H01Q 5/335* (2015.01); *H01Q 9/30* (2013.01); *H01Q 11/08* (2013.01); *H03H 7/38* (2013.01)

(58) Field of Classification Search
CPC .......... H01Q 11/08; H01Q 1/242; H01Q 9/22; H01Q 7/08; H01Q 1/085
(Continued)

(56) References Cited

U.S. PATENT DOCUMENTS 5,057,849 A * 10/1991 Dorrie .................... H01Q 5/321
                                                              343/722
5,668,565 A *  9/1997 Robinson ............... H01Q 1/085
                                                               333/34
(Continued)

FOREIGN PATENT DOCUMENTS

EP      1443599 A1    8/2004
WO    2006108289 A1   10/2006

OTHER PUBLICATIONS

Paulino, et al.; Design of a spiral-mode microstrip antenna and matching circuitry for ultra-wide-band receivers; May 26, 2002; pp. 875-878.
(Continued)

*Primary Examiner* — Dameon E Levi
*Assistant Examiner* — Ab Salam Alkassim, Jr.
(74) *Attorney, Agent, or Firm* — Barbara R. Doutre

(57) ABSTRACT

An antenna (100) with an embedded wideband matching substrate (102) is provided. The substrate (102) comprises impedance matching circuitry (300) providing a low frequency (LF) matching circuit (330) and a high frequency (HF) matching circuit (340) for tri-band operation. A stripline (314) having a stripline ground (324) is disposed on the substrate. The stripline (314) provides a matching element and the stripline ground (324) provides a common ground (324) for both the HF and LF matching circuits. The substrate (102) is shaped with a tabular portion (106) which facilitates encasing the substrate (102) within a casing (118). The tabular portion (106) further provides an alignment feature for wrapping of a flexible radiating element about the casing and flexible antenna rod (126) to complete the antenna structure (100).

22 Claims, 8 Drawing Sheets

(51) Int. Cl.
    *H01Q 9/30*     (2006.01)
    *H01Q 5/335*     (2015.01)
    *H01Q 1/24*     (2006.01)
    *H01Q 11/08*     (2006.01)
    *H03H 7/38*     (2006.01)

(58) Field of Classification Search
    USPC ........................................................ 343/895
    See application file for complete search history.

(56) References Cited

U.S. PATENT DOCUMENTS

| | | | | |
|---|---|---|---|---|
| 5,898,406 A * | 4/1999 | Matero | ............... | H01Q 1/24 |
| | | | | 343/702 |
| 6,078,223 A * | 6/2000 | Romanofsky | ............ | H03L 7/04 |
| | | | | 331/107 S |
| 6,307,525 B1 * | 10/2001 | Bateman | ............... | H01Q 1/246 |
| | | | | 333/126 |
| 6,445,262 B1 * | 9/2002 | Tanaka | ............... | H03H 7/463 |
| | | | | 333/101 |
| 6,587,081 B2 * | 7/2003 | Noro | ............... | H01Q 1/362 |
| | | | | 343/853 |
| 6,788,259 B2 | 9/2004 | Amano et al. | | |
| RE40,129 E | 3/2008 | Warnagiris | | |
| 8,049,578 B1 * | 11/2011 | Albers | ............... | H01P 1/20345 |
| | | | | 333/134 |
| 2002/0186090 A1 * | 12/2002 | Lopez | ............... | H01P 5/187 |
| | | | | 333/33 |
| 2003/0021356 A1 * | 1/2003 | Okuda | ............... | H04B 1/48 |
| | | | | 375/288 |
| 2003/0022638 A1 * | 1/2003 | Imai | ............... | H04B 1/005 |
| | | | | 455/107 |
| 2003/0164244 A1 * | 9/2003 | Miyazawa | ............ | H01P 1/047 |
| | | | | 174/520 |
| 2005/0156796 A1 * | 7/2005 | Nysen | ............... | H01Q 1/2275 |
| | | | | 343/702 |
| 2007/0024518 A1 * | 2/2007 | Miyoshi | ............ | H01Q 1/2216 |
| | | | | 343/895 |
| 2008/0238789 A1 * | 10/2008 | Wilcox | ............... | H04B 1/0458 |
| | | | | 343/750 |
| 2009/0009390 A1 * | 1/2009 | Lee | ............... | H01Q 13/085 |
| | | | | 342/371 |
| 2009/0058554 A1 * | 3/2009 | Ozden | ............... | H03H 7/38 |
| | | | | 333/129 |
| 2009/0295672 A1 | 12/2009 | Grossman et al. | | |
| 2010/0033398 A1 | 2/2010 | Jung et al. | | |
| 2012/0119844 A1 * | 5/2012 | du Toit | ............... | H01P 5/04 |
| | | | | 333/17.3 |
| 2012/0119964 A1 * | 5/2012 | Ngo Bui Hung | ........ | H01Q 5/00 |
| | | | | 343/787 |
| 2012/0208480 A1 | 8/2012 | Peng et al. | | |
| 2013/0069835 A1 * | 3/2013 | Swais | ............... | H01Q 1/3275 |
| | | | | 343/715 |
| 2013/0187824 A1 * | 7/2013 | Kato | ............... | H04B 1/0458 |
| | | | | 343/852 |
| 2014/0028521 A1 * | 1/2014 | Bauder | ............... | H03H 7/38 |
| | | | | 343/861 |
| 2014/0073267 A1 * | 3/2014 | Cabanillas | ........... | H04B 1/0458 |
| | | | | 455/79 |
| 2014/0162719 A1 * | 6/2014 | Han | ............... | H04W 88/06 |
| | | | | 455/552.1 |
| 2014/0273887 A1 * | 9/2014 | Black | ............... | H03H 7/40 |
| | | | | 455/77 |
| 2014/0333495 A1 * | 11/2014 | Vazquez | ............... | H01Q 9/06 |
| | | | | 343/745 |
| 2015/0035710 A1 * | 2/2015 | Lin | ............... | H01Q 1/283 |
| | | | | 343/745 |
| 2015/0236747 A1 * | 8/2015 | Baudin | ............... | H04B 1/401 |
| | | | | 375/219 |
| 2015/0264343 A1 * | 9/2015 | Bush | ............... | H04L 12/413 |
| | | | | 725/107 |
| 2016/0013553 A1 * | 1/2016 | Contreras | ............... | H01Q 5/50 |
| | | | | 343/702 |

OTHER PUBLICATIONS

Stripline, From Wikipedia, the free encyclopedia, Dec. 2007, all pages.

* cited by examiner

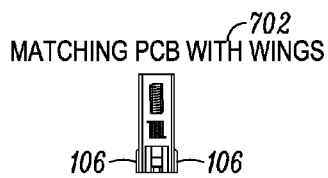
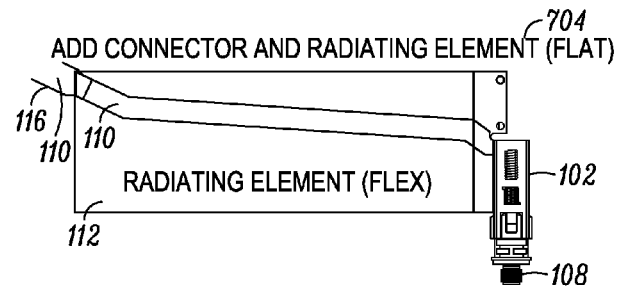
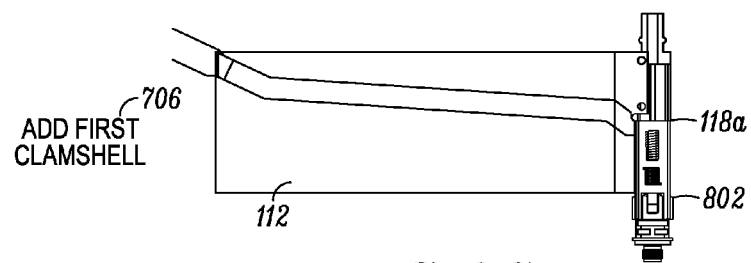
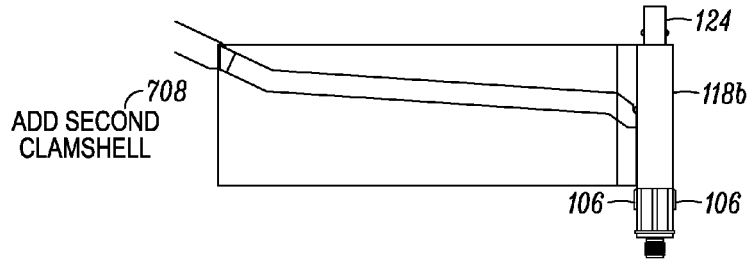
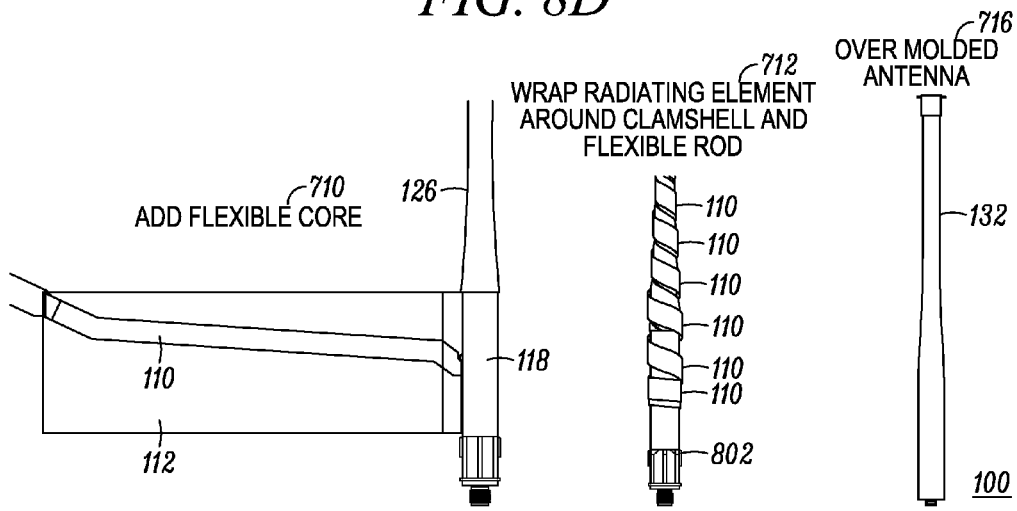
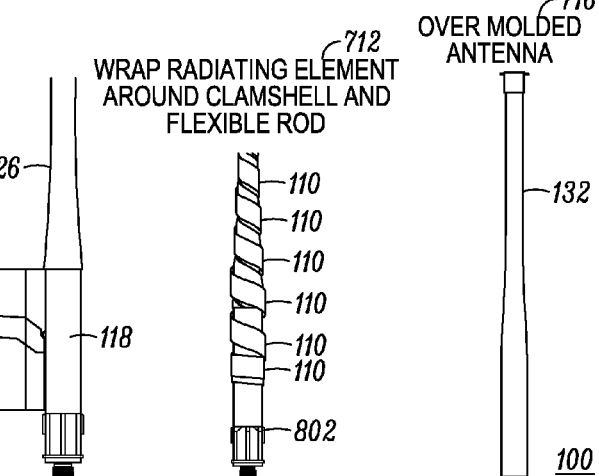

ANTENNA WITH EMBEDDED WIDEBAND MATCHING SUBSTRATE

FIELD OF THE DISCLOSURE

The present invention relates generally to antennas and more particularly to antennas having wideband matching for multi-band applications.

BACKGROUND

Communication devices, such as portable two-way radios, which operate over different frequency bands are considered desirable, particularly in the public-safety arena where such devices are used by such agencies as police departments, fire departments, emergency medical responders, and military to name a few. The use of separate antennas to cover different frequency bands is often not a practical option in view of the portability and size limitations of such devices. Multi-band antenna structures can be used to cover multiple bands providing overall wideband operation. To achieve multi-band operation a matching network is needed. The matching network is typically situated on a rigid printed circuit board (PCB), which may be placed within the communication device or possibly the antenna itself. Size constraints and efficiency of operation are major concerns in antenna designs incorporated within the antenna structure. Prohibitively large structures can cause the antenna to be very stiff and susceptible to breakage.

Accordingly, there is a need for an improved antenna which overcomes the aforementioned concerns.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIGS. 8A-8G provide a pictorial for assembling the antenna in accordance with the various embodiments.

Figure 1:
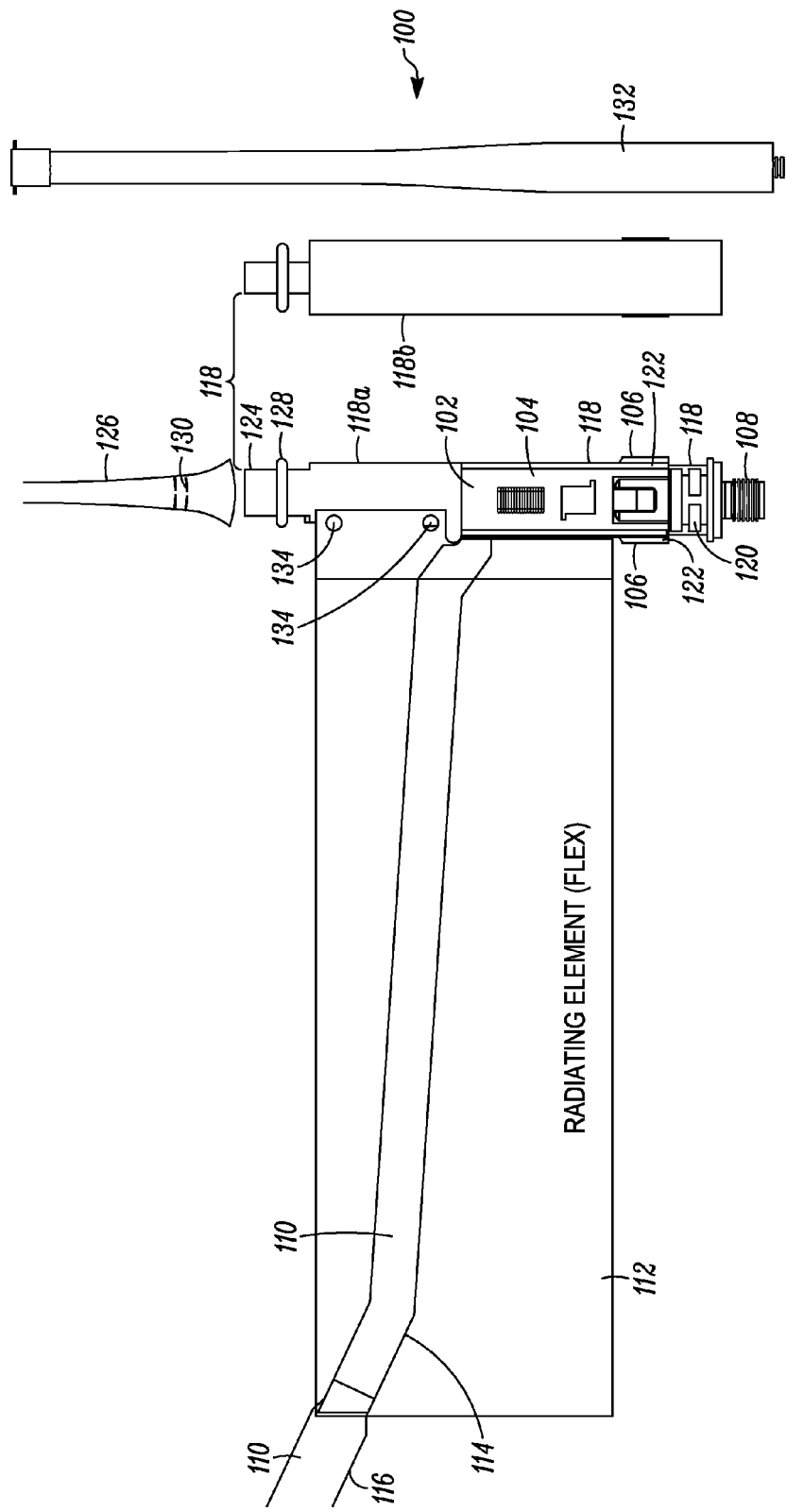
FIG. 1 is an antenna having a printed circuit board with impedance matching circuitry disposed thereon formed in accordance with the various embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Briefly, there is provided herein a multi-band antenna structure with improved ruggedness and multi-band operation. A printed circuit board (PCB) hosts lumped-elements and an embedded radio frequency (RF) stripline for impedance-matching. The stripline provide a common ground for all bands of operation thereby negating the need for a dedicated ground layer. In addition to impedance matching, the PCB is further shaped to provide side tabs which facilitate wrapping of an antenna radiator element as well as an anti-rotation feature. The antenna structure is particularly applicable to hand held wireless communication products, such as portable two-way radio subscriber units, where available space within the housing is very limited. The single combined structure operates over a plurality of frequency bands, such as very high frequency (VHF) band (about 136-174 MHz), an ultra high frequency (UHF) band (about 380-520 MHz), and a 7/800 MHz frequency band (764-869 MHz). A radio incorporating the new antenna structure is particularly advantageous for public-safety providers (e.g., police, fire department, emergency medical responders, and military) because of its improved ruggedness and flexibility.

FIG. 1 is an antenna 100 shown in a partially assembled state and a fully assembled state in accordance with the various embodiments. Embedded within antenna 100 is a substrate 102, such as a printed circuit board, with impedance matching circuitry 104 disposed on both sides. The impedance matching circuitry 104 provides multi-band operation and will be discussed in further detail in conjunction with subsequent figures. In accordance with the various embodiments, the matching PCB 102 is formed having side tabs 106. Side tabs 106 will also be referred to as first and second side tabs 106 and tabular portion 106. A radio frequency (RF) connector 108 and radiating element 110 are coupled to the PCB 102. The RF connector 108 may be soldered, or otherwise attached, to signal pads or other input means on the PCB 102. The input may be located in the tabular portion 106 of the PCB 102. The radiating element 110 is an elongated flat conductive element having a first portion 114 disposed on a non-conductive flex 112 and a second portion 116 extending off the flex 112 at an angle suitable for wrapping into a helical shape. Examples of the conductive element 110 may be found, for example, in co-owned patent application Ser. No. 13/471,721 filed May 15, 2012 which is hereby incorporated by reference. The conductive element 110 may be formed of other shapes and angles suitable for wrapping into a helical formation.

In accordance with the various embodiments, the radiating element 110 disposed on flex 112 is coupled to the PCB 102 along a non-tab portion of the PCB, above the tabular portion 106. A casing 118, formed of a first casing half 118a and a second casing half 118b, is used to encase the PCB 102 and the internal coupling 120 of RF connector 108, thereby protecting the matching circuitry 104 and connector. The flex 112 is coupled to the first half casing 118a by peg and hole couplings 134, or other coupling means. When coupled together, the first and second casing halves form slots 122 through which the tabs 106 extend externally while the matching circuitry 104 of PCB 102 and internal coupling 120 of RF connector 108 are encased.

The first and second casing halves 118a, 118b may be pre-molded parts formed of plastic, or other suitably rigid material, which encase the matching circuitry while leaving the tabs external to the casing through slots 122. When coupled together, the first and second casing halves 118a, 118b further form an upper cylindrical extension 124 having a détente feature 128. The antenna 100 further comprises a flexible rod 126 having an opening within which is located an alignment feature 130, such as a ring or a recess, molded therein. The alignment feature 130 is captured by détentes 128 upon sliding the rod 126 over the casing's upper cylindrical extension 124. The first casing half 118a and the second casing half 118b are thus initially held in place as casing 118 by the flexible antenna core 126.

The first portion 114 of radiating element 110 is coupled to an antenna feed point (shown later in FIGS. 2 and 3) disposed on the PCB 102. The first portion 114 of radiating element 110 disposed on the flex 112 is wrapped around the casing 118 with overlapping turns. The flex 112 may be formed of a suitable non-conductive dielectric based material, such as polyester (Mylar, polyimide (Kapton) or other suitable material. The tabs 106 advantageously provide a ledge or abutment that facilitates the alignment and wrapping of flex 112 having radiating element 110 disposed thereon about the casing. The tabs 106 further provide anti-rotation of the PCB 102 within the casing 118. The second portion 116 of radiating element 110 is wrapped about the flexible rod 126 with non-overlapping turns (as will be shown in subsequent views). The completed antenna with an overmold 132, such as an overmold of flexible rubber, silicon, or other suitable material, is shown as antenna 100.

Figure 2:
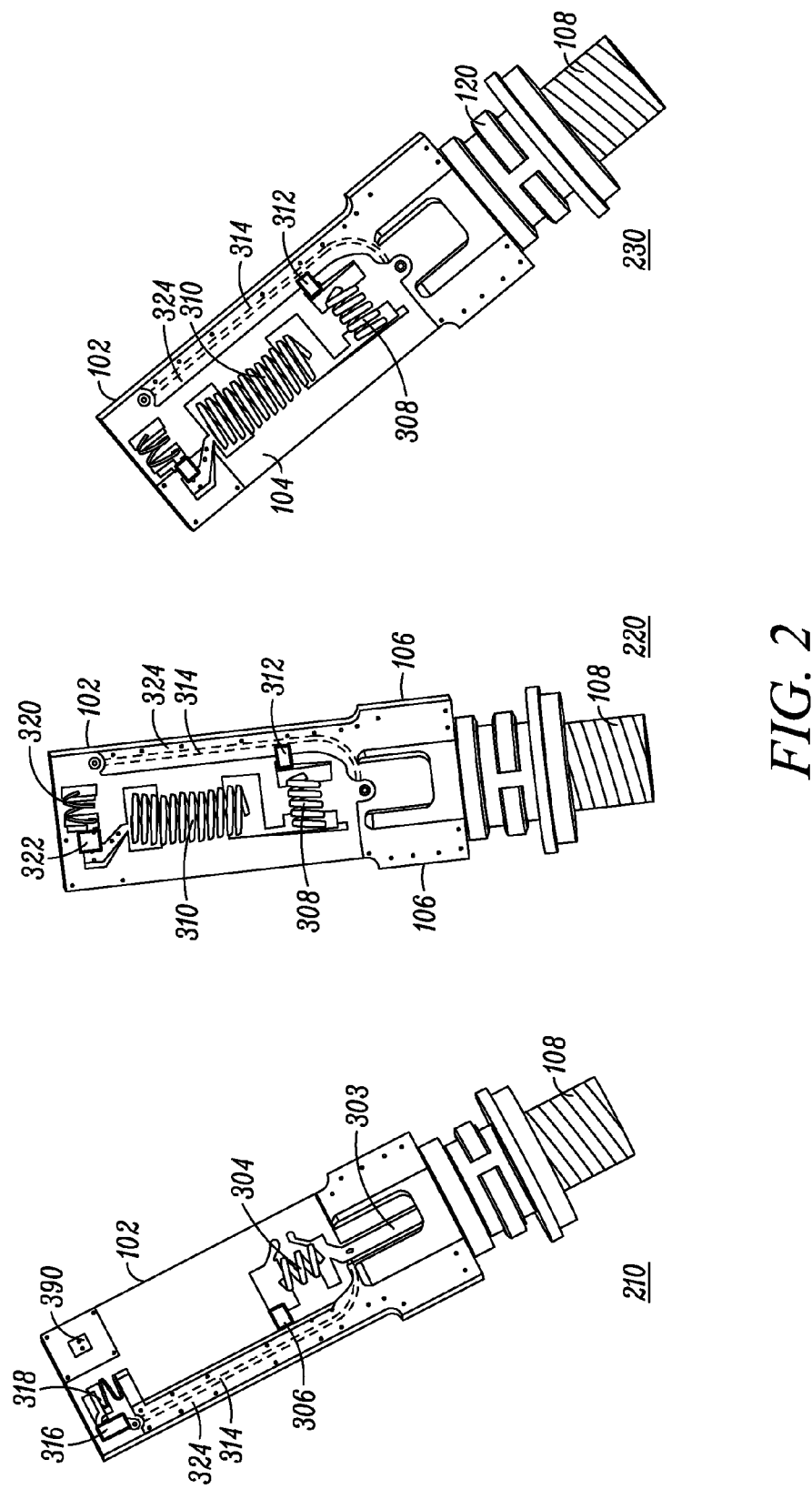
FIG. 2 shows different views of a printed circuit board with impedance matching circuitry disposed thereon in accordance with various embodiments.
Figure 3:
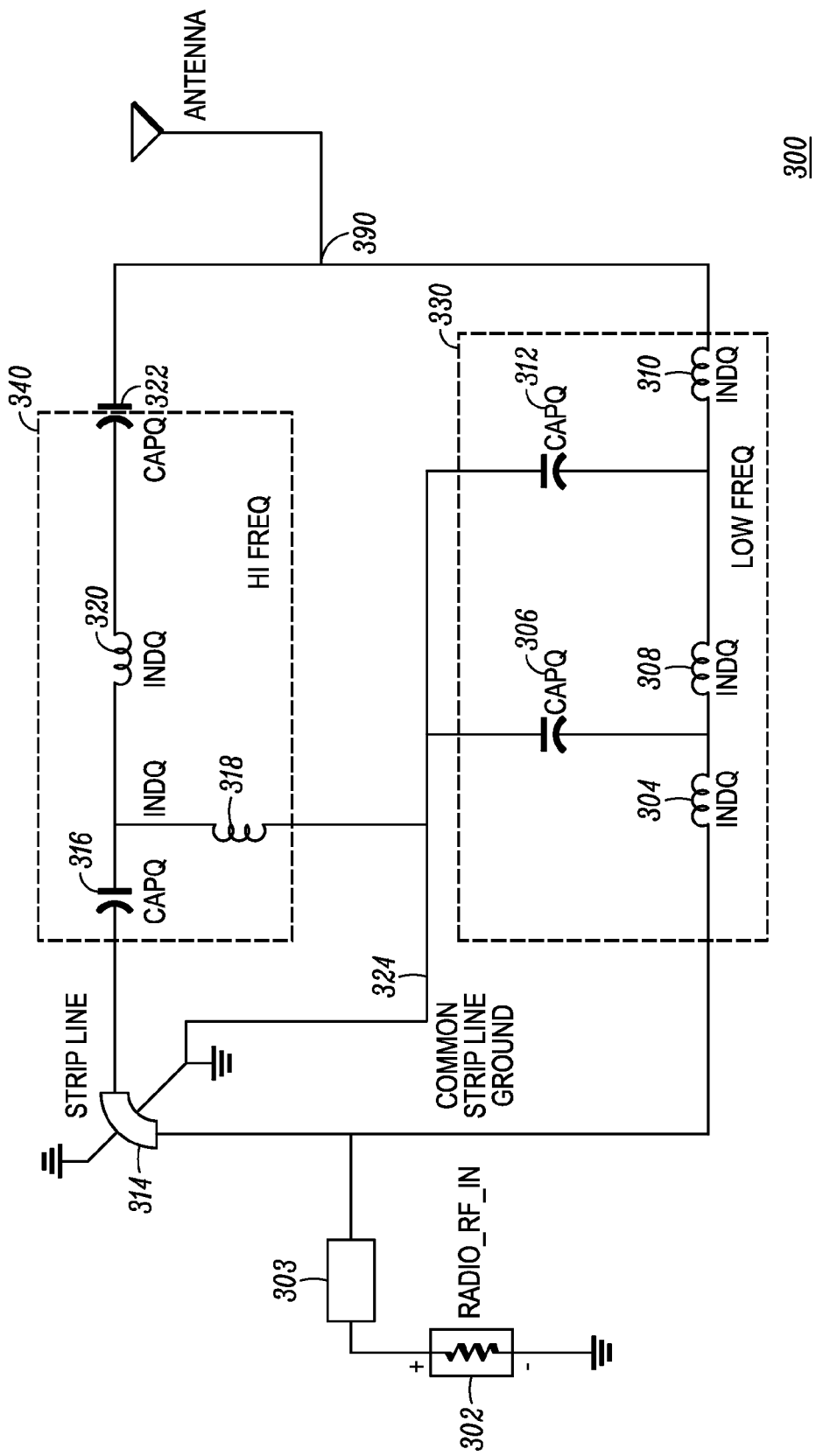
FIG. 3 is an impedance matching circuit for multi-band operation in accordance with the various embodiments.

FIG. 2 shows the PCB 102 having matching circuitry 104 disposed on first and second sides of the PCB. FIG. 3 is an impedance matching circuit disposed on the PCB 102 in accordance with the various embodiments. Referring to FIGS. 2 and 3, the matching circuitry (generally shown in FIG. 1 by designator 104) comprises a diplexed matching circuit 300 in which current is fed through RF input 302 at connector 108 then continues through microstrip 303 and then splits after microstrip 303 into two paths into matching circuits 330, 340. An antenna feed point 390 is disposed at the output of the two paths (to which the radiator element 110 is coupled).

In accordance with the various embodiments, the PCB 102 does not have a ground plane beyond the end of microstrip 302. This split approach reduces coupling between circuits. The following bands are covered by circuit 300, VHF (136-174 MHz) through path 330, and UHF (380-520 MHz) and 7-800 MHz (764-869 MHz) through path 340.

The diplexed matching circuit 300 provides two signal paths, a low frequency path 330 for very high frequency (VHF) and a high frequency path 340 for ultra high frequency (UHF) and 7/800 MH. This two path approach combined with the absence of a ground plane advantageously minimizes parasitics. Circuit 300 incorporates a stripline 314 embedded within a stripline ground 324. In accordance with the various embodiments, the stripline ground 324 provides a common ground for both the high frequency path 340 and the low frequency path 330. The stripline operates as a matching element and ground to provide a return current path for both high and low frequency. The stripline 314 is formed of a predetermined length and width which together with the matching circuitry 104 of paths 330, 340 controls the broadband frequency response of the antenna. The stripline ground 324 has a predetermined width of no more than 10 times the predetermined width of the stripline 314, thus being substantially less than a complete dedicated ground layer. The use of the stripline 314 beneficially negates the need for a dedicated RF ground layer.

The low frequency matching circuit 330 is formed of a plurality of lumped element impedance matching components comprising series coupled inductors 304, 308, 310 with capacitors 306, 312 coupled between the inductors to the common stripline ground 324.

During operation of the VHF band, a VHF signal is received at RF input 302 (blocked by capacitor 316 in path 340) which is filtered through two low pass filters, one formed inductor 304, capacitor 306, and inductor 308, and another formed of inductor 310 and capacitor 312. Capacitor 322 provides a blocking capacitor to prevent low frequency feedback into the high frequency path 340.

The high frequency matching circuit 340 is formed of a plurality of lumped element impedance matching components comprising capacitor 316 in series with inductor 320 having inductor 318 coupled in between to the common stripline ground 324, in a high pass filter formation. The matching at UHF and 7/800 MHz is significantly improved by allowing components to be placed very close to the antenna feed point 390 thereby reducing significantly the phase delays that have hampered past broadband matching circuits.

During operation of the UHF band or 7/800 MHz band, the high frequency signal is received at RF input 302 and coupled through stripline 314 for filtering through the high pass filter formed of capacitor 316, inductor 318 and inductor 320. High frequency choke 310 prevents high frequency feedback into the low frequency path 330.

The matching circuit 300 advantageously comprises a minimal amount of components, for example ten components including the stripline were used in this embodiment, which beneficially allows the layout to accommodate orthogonal placement of the inductors relative to each other to further minimize coupling. The use of fewer components and improved layout is further advantageous in terms of manufacturability and cost.

Figure 4:
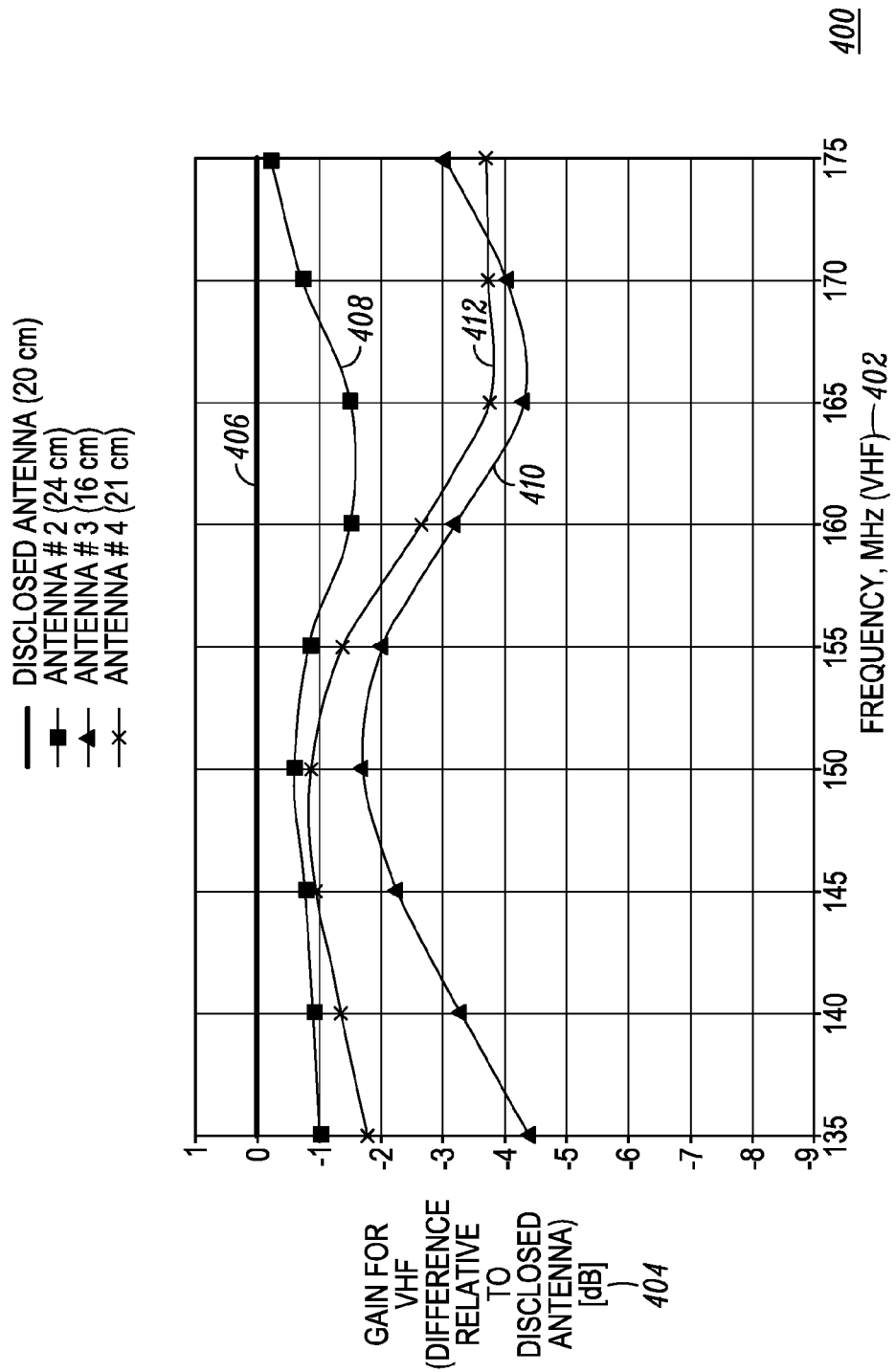
FIG. 4 is an example of sample data comparing an antenna formed in accordance with the various embodiments to other antennas operating in the VHF frequency band.
Figure 5:
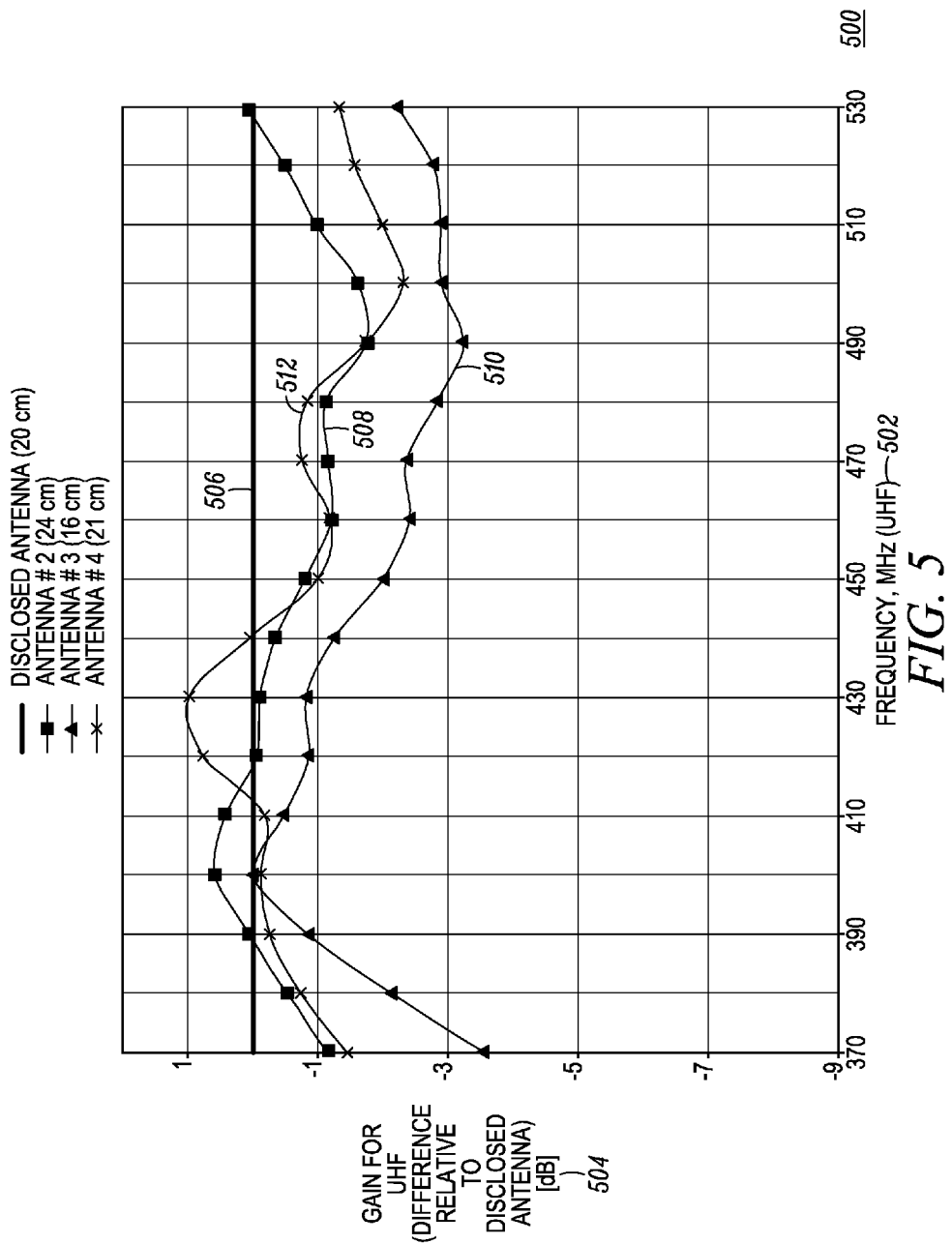
FIG. 5 is an example of sample data comparing the antenna formed in accordance with the various embodiments to other antennas operating in the UHF frequency band.
Figure 6:
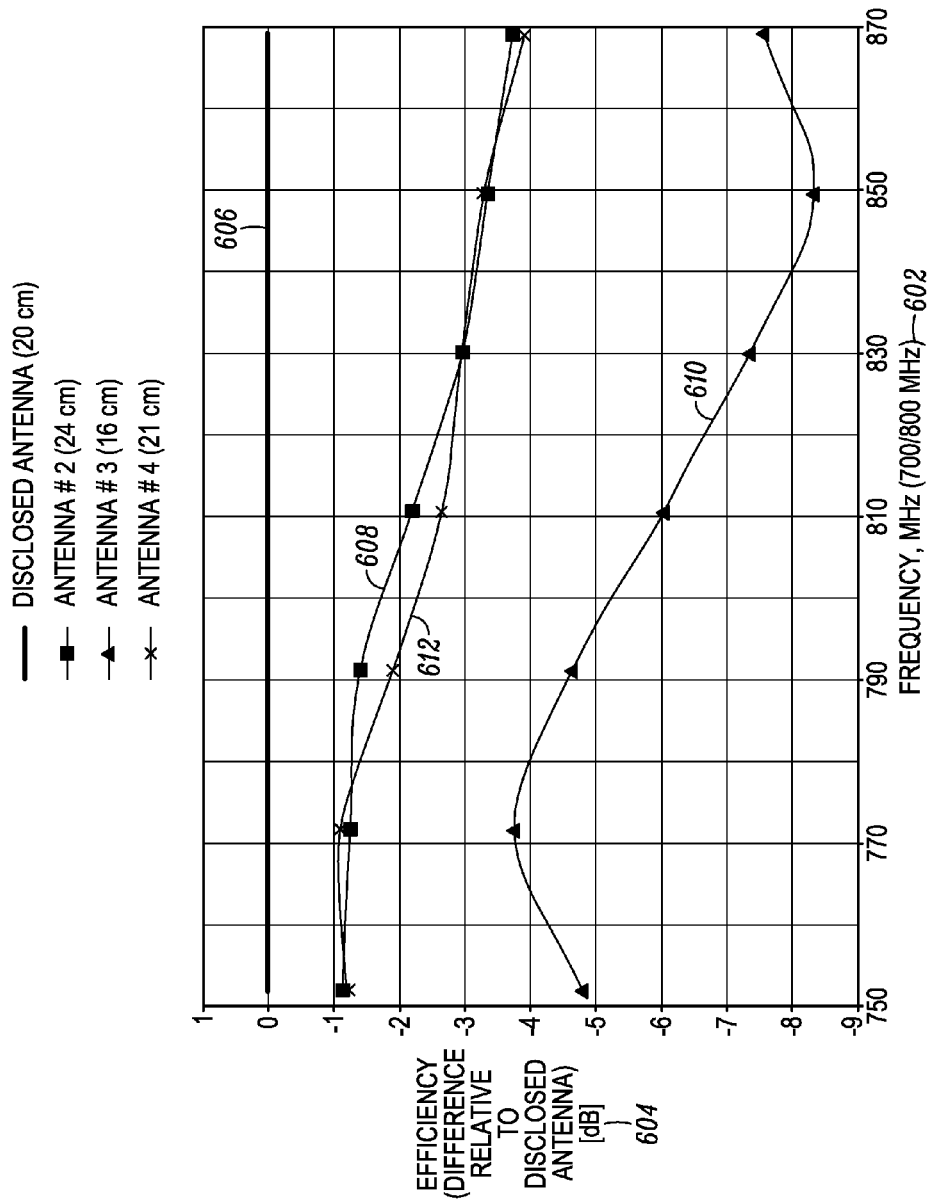
FIG. 6 is an example of sample data comparing the antenna formed in accordance with the various embodiments to other antennas operating in the 7/800 MHz frequency band.

FIGS. 4, 5, and 6 show data taken with an antenna formed in accordance with the various embodiments compared to three other multi-band antennas available in the industry. The same antennas were used for testing across all three bands. The antenna formed in accordance with the various embodiments is referred to as the disclosed antenna (406, 506, 606) having a length of 20 cm. The other antennas had different lengths such as 24 cm, 16 cm and 21 cm.

FIG. 4 is an example of data comparing an antenna formed in accordance with the various embodiments to other antennas operating in the VHF frequency band. The horizontal axis shows frequency in the VHF band while the y-axis shows gain of the other multi-band antennas relative to the disclosed antenna. The disclosed antenna is shown as a baseline 406 as compared to three other multi-band antennas 408, 410, 412 operating in the VHF band. Graph 400 demonstrates that the antenna 406 provided improved gain over the other sampled antennas operating in the VHF band.

FIG. 5 is an example of data comparing the antenna formed in accordance with the various embodiments to other antennas operating in the UHF frequency band. The horizontal axis shows frequency in the UHF band while the y-axis shows gain of other sampled multi-band antennas relative to the disclosed antenna. The disclosed antenna is shown as a baseline 506 as compared to three other multi-band antennas 508, 510, 512 operating in the UHF band. Graph 500 demonstrates that the disclosed antenna 506 provided similar or improved gain over other sampled antennas operating in the UHF band.

FIG. 6 is an example of data comparing the antenna formed in accordance with the various embodiments to other antennas operating in the 7/800 MHz frequency band. The horizontal axis shows frequency in the 7/800 MHz band while the y-axis shows efficiency of other sampled multi-band antennas relative to the disclosed antenna. The disclosed antenna is shown as a baseline 606 as compared to three other multi-band antennas 608, 610, 612 operating in the 7/800 MHz band. Graph 600 demonstrates that the disclosed antenna 606 provided improved efficiency over the other sampled antennas operating in the 7/800 MHz band.

Overall the sample data has shown that an antenna formed in accordance with the various embodiments can achieve improved or similar performance to available antennas, across multiple bands with very few components in a ruggedized structure. The matching circuit 300 advantageously comprises only ten components including the stripline thereby minimizing size and cost while providing tri-band operation. While other circuit configurations may be used, the use of the stripline providing a common ground for the low frequency matching circuitry and high frequency matching circuitry negates the need for a dedicated ground layer thereby minimizing mutual coupling.

Figure 7:
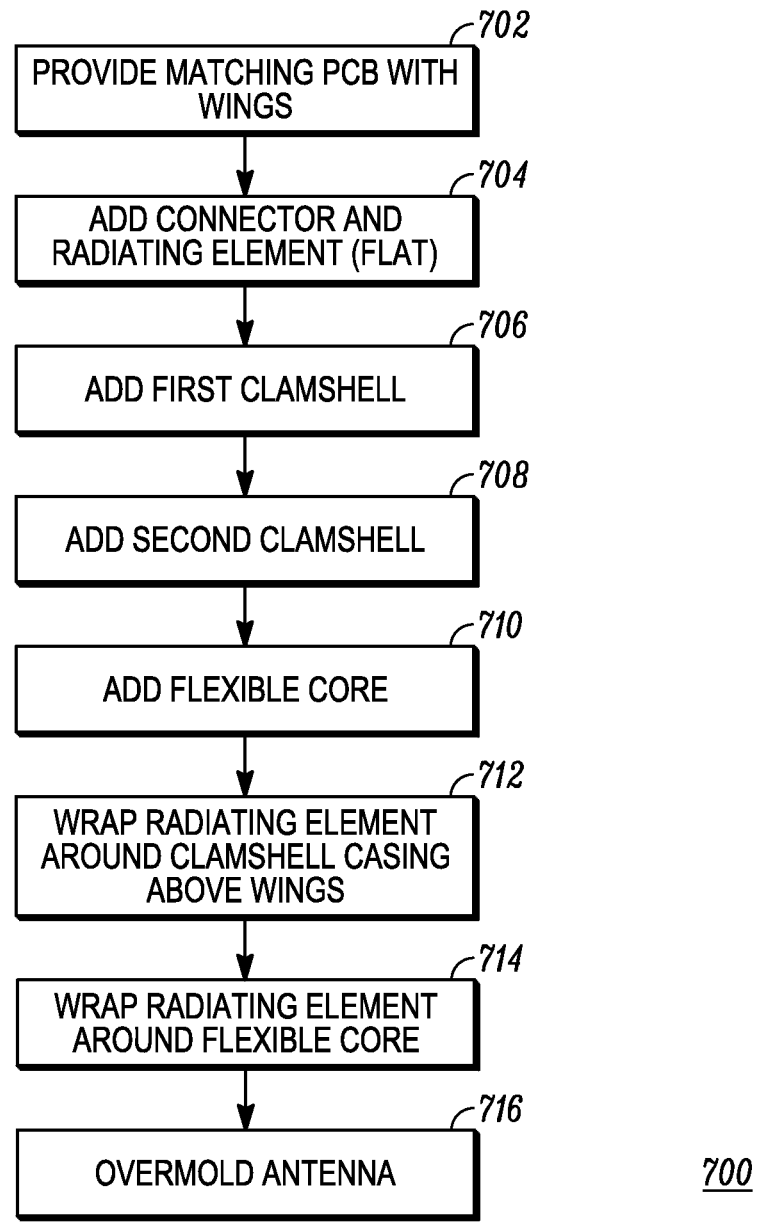
FIG. 7 is a flowchart for assembling the antenna in accordance with the various embodiments.

FIG. 7 is a flowchart for assembling the antenna in accordance with the various embodiments. Method 700 begins at 702 by providing a matching PCB with tabs extending therefrom, such as that previously described. An RF connector and radiating element disposed on a flex are added to the PCB at 704. For example, the RF connector may be soldered to the PCB. The radiating element is flat and has a first portion disposed on the flex. The radiating element may be aligned and soldered to the PCB at the non-tab portion of the board. A first casing half is added at 706, such as previously described. The first casing half may be a pre-molded part that encases the matching circuitry while leaving the tabs extending out from the sides of the casing. A second casing half is added at 708. This second casing half completes the encasement of the matching circuitry of the PCB, leaving the tabs external to the casing. When coupled together, the first and second halves for a complete casing further comprising an upper cylindrical extension about which the flexible rod or core is added 710. At this point, the first and second halves are held in place by the flexible core being positioned over the upper cylindrical portion of the casing. The radiating element is then wrapped around the casing at 712 (with overlapping turns) and the flexible rod at 714 (with non-overlapping turns). The structure is overmolded at 714 to complete the antenna.

FIG. 8A-8G is a pictorial for assembling the antenna in accordance with the various embodiments and will be described while referring back to FIG. 7 and the element designators from previous figures. FIG. 8A shows the matching PCB 102 with side tabs 106, such as described at step 702. FIG. 8B shows the RF connector 108 and radiating element 110 disposed on a flex 112 coupled to the PCB 102, which were added at step 704. The radiating element 110 is coupled to the PCB 102 along the non-tab portion of the PCB 102. The addition of the first casing half 118a is shown FIG. 8C, as described at 706. FIG. 8D shows the second casing half 118b that was added at 708. This second casing half 118b completes the encasement of the matching circuitry of the PCB, while leaving the tabs 106 external to the casing. When coupled together, the first and second casing halves 118a, 118b further comprise the upper cylindrical extension 124 about which the flexible rod or core 126 was added at 710. FIG. 8E shows the complete casing 118 being held in place by the flexible antenna core 126. The use of the détente 128 and rod 126 with alignment feature 130 facilitates alignment of the assembly. FIG. 8F shows radiating element 110 wrapped around the casing, as described at 712, (with overlapping turns) and then wrapped at the flexible rod (as described at 714) (with non-overlapping turns). The tabs 106 have advantageously aided in the alignment and wrapping of the radiating element 110 in addition to providing anti-rotation of the PCB within the casing 118. FIG. 8G shows the overmold 132 added to complete the structure of the antenna (as described at 714).

Unlike other approaches to multi-band antenna structures which utilize lumped element matching sections at the bottom of the radiating antenna, the new approach provided by the various embodiments provides an antenna matching structure that features a distinctive embedded RF stripline as part of the high frequency path of the diplexer matching circuit. The stripline operates as a matching element and ground. The matching element and ground provided by the stripline provide a return current path for both high and low frequency. This stripline approach negates the need for a dedicated ground layer thereby reducing mutual coupling between the low frequency and high frequency circuits. The disclosed matching structure provided by the various embodiments allows for the simultaneous excitation of efficient radiating modes at the required public safety bands. For example, prototypes of the disclosed antenna utilize nine matching components and a stripline on the PCB, while other tri-band antennas may utilize twenty components without an embedded stripline. Additionally, the tabs of the PCB improve the manufacturability of the overmolded antenna by adding an anti rotation mechanism and alignment feature thereby improving ruggedness of the overall antenna.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An impedance matching structure for an antenna radiator element, comprising:
    a printed circuit board (PCB) having no dedicated ground layer;
    a radio frequency (RF) input coupled to a microstrip disposed on the PCB;
    a diplexed matching circuit located after the microstrip comprising:
        a low frequency (LF) matching circuit, formed of a low pass filter providing a low frequency path, disposed on the PCB;
        a high frequency (HF) matching circuit, formed of a high pass filter providing a high frequency path, disposed on the PCB;
        wherein current fed through the RF input continues through the microstrip and then splits after the microstrip into two paths into the LF and HF matching circuits;
    a RF stripline embedded within a stripline ground within the PCB between the microstrip and the HF matching circuit as part of the high frequency path of the diplexed matching circuit, the embedded RF stripline providing matching and a common ground for both the HF and LF matching circuits, the matching and common ground provided by the embedded RF stripline providing a return current path for both the HF and LF matching circuits; and
    an antenna feed point for coupling to the antenna radiator element, the antenna feed point disposed on the PCB at an output joining outputs of the LF matching circuit and the HF matching circuit.

2. The impedance matching structure of claim 1, further comprising:
    an antenna feed point disposed on the PCB; and
    wherein components of the HF matching circuit are placed proximate to the antenna feed point.

3. The impedance matching structure of claim 1, wherein the common ground provided by the stripline minimizes coupling between the LF matching circuit and the HF matching circuit.

4. The impedance matching structure of claim 1, wherein the PCB comprises a tabular portion.

5. The impedance matching structure of claim 4, further comprising:
    a casing having slots; and
    the tabular portion of the PCB being retained by and extending beyond the slots of the casing.

6. The impedance matching structure of claim 5, wherein the tabular portion of the PCB prevents rotation of the PCB within the casing.

7. The impedance matching structure of claim 5, wherein the casing is formed of first and second casing halves.

8. The impedance matching structure of claim 1, wherein the LF matching circuit operates over a VHF band, and the HF matching circuit operates over a UHF band and a 7/800 MHz band.

9. An antenna structure for an antenna radiator element, comprising:
    a casing;
    a flexible rod coupled to the casing;
    a rolled conductive strip wrapped about the casing with overlapping successive turns;
    a printed circuit board (PCB) retained within the casing, the PCB having no dedicated ground layer;
    a radio frequency (RF) input coupled to a microstrip disposed on the PCB;
    a diplexed matching circuit located after the microstrip on the PCB, comprising:
        a low frequency (LF) matching circuit, formed of a low pass filter providing a low frequency path, disposed on the PCB;
        a high frequency (HF) matching circuit, formed of a high pass filter providing a high frequency path, disposed on the PCB, wherein current fed through the RF input continues through the microstrip and then splits after the microstrip into two paths into the LF and HF matching circuits; and
        a RF stripline coupled between the microstrip and the HF matching circuit as part of the high frequency path of the diplexed matching circuit, the embedded RF stripline having a stripline ground within the PCB providing matching and a common ground to both the LF matching circuit and the HF matching circuit, the matching and common ground provided by the embedded RF stripline providing a return current path for both the HF and LF matching circuits; and
    an antenna feed point for coupling to the antenna radiator element, the antenna feed point disposed on the PCB at an output joining outputs of the LF matching circuit and the HF matching circuit.

10. The antenna structure of claim 9, further comprising:
first and second slots within the casing;
tabs on the PCB; and
the tabs of the PCB being retained by and extending beyond the slots of the casing thereby preventing rotation of the PCB within the casing.

11. The antenna structure of claim 9, wherein the stripline comprises a predetermined length and predetermined width, and wherein the predetermined length and predetermined width of the stripline and the LF matching circuit and the HF matching circuit control a broadband frequency of the antenna.

12. The antenna structure of claim 9, wherein the antenna has a length shorter than or equal to 20 centimeters (cm).

13. The antenna structure of claim 9, further comprising:
an internal alignment feature molded into the flexible rod; and
a détente feature coupled to the casing, the alignment feature and détente feature for capturing and retaining the flexible rod to the casing.

14. The antenna structure of claim 9, wherein the common ground provided by the stripline comprises a predetermined width of no more than 10 times that of the stripline.

15. The antenna structure of claim 9, wherein the LF matching circuit operates over a VHF band, and the HF matching circuit operates over a UHF band and a 7/800 MHz band.

16. The antenna structure of claim 9, further comprising a helical radiator element wrapped about the casing and flexible rod.

17. The impedance matching structure of claim 1, wherein the embedded RF stripline is formed of a predetermined length and width which together with the low frequency matching circuit and the high frequency matching circuit controls the broadband frequency response of the antenna radiator element.

18. The impedance matching structure of claim 1, wherein the stripline ground has a predetermined width of no more than 10 times a predetermined width of the embedded RF stripline.

19. The antenna structure of claim 9, wherein the embedded RF stripline is formed of a predetermined length and width which together with the low frequency matching circuit and the high frequency matching circuit controls the broadband frequency response of the antenna radiator element.

20. The antenna structure of claim 9, wherein the stripline ground has a predetermined width of no more than ten times a predetermined width of the embedded RF stripline.

21. The impedance matching structure of claim 1, wherein the embedded RF stripline and absence of dedicated ground layer reduces mutual coupling between the low frequency and high frequency circuits.

22. The antenna structure of claim 9, wherein the embedded RF stripline and absence of dedicated ground layer reduces mutual coupling between the low frequency and high frequency circuits.

\* \* \* \* \*